United States Patent

New

[11] Patent Number: 5,824,590
[45] Date of Patent: Oct. 20, 1998

[54] METHOD FOR OXIDATION AND CRYSTALLIZATION OF FERROELECTRIC MATERIAL

[75] Inventor: Daryl C. New, Meridian, Id.

[73] Assignee: Micron Technology, Inc., Boise, Id.

[21] Appl. No.: 685,049

[22] Filed: Jul. 23, 1996

[51] Int. Cl.⁶ .................... H01L 21/324; H01L 21/477
[52] U.S. Cl. ................ 438/393; 438/3; 438/240; 257/310
[58] Field of Search ................... 438/393, 240, 438/3; 257/310

[56] References Cited

U.S. PATENT DOCUMENTS

| | | | |
|---|---|---|---|
| 4,888,820 | 12/1989 | Chen et al. | 361/313 |
| 5,189,503 | 2/1993 | Suguro et al. | 257/310 |
| 5,439,845 | 8/1995 | Watanabe et al. | 438/396 |
| 5,561,307 | 10/1996 | Mihara et al. | 257/295 |
| 5,696,018 | 12/1997 | Summerfelt et al. | 1/1 |

*Primary Examiner*—John Niebling
*Assistant Examiner*—Ha Tran Nguyen
*Attorney, Agent, or Firm*—Workman, Nydegger & Seeley

[57] ABSTRACT

A two-step method of low temperature oxidation of a ferroelectric layer followed by high temperature crystallization of the ferroelectric film to protect underlying semiconductor layers against high temperature oxidation which can cause the conductive layers thereof to become nonconductive. The thus provides a barrier layer on a semiconductor wafer, depositing a ferroelectric layer on the barrier layer, heating the semiconductor wafer at a temperature in a range of about 400° C. to about 700° C. in the presence of oxygen to oxidize the ferroelectric layer, and then heating the semiconductor wafer at a temperature in a range of about 700° C. to about 900° C. in a non-oxidizing ambient to crystallize the oxidized, ferroelectric layer.

37 Claims, 1 Drawing Sheet

METHOD FOR OXIDATION AND CRYSTALLIZATION OF FERROELECTRIC MATERIAL

BACKGROUND OF THE INVENTION

1. The Field of the Invention

This invention relates to the formation of composite structures situated on a semiconductor wafer. More particularly, the present invention is directed to an improved method for the oxidation and crystallization of a ferroelectric layer situated on a semiconductor wafer.

2. The Background of the Invention

Ferroelectric materials, including dielectric materials such as high dielectric constant materials, are commonly employed in the manufacture of semiconductors. Ferroelectric layers are useful in capacitors, in DRAM, and in a variety of other settings.

On the one hand, ferroelectric layers are essentially complex oxides. On the other hand, crystallization of ferroelectric material is one of the most important parts of achieving ferroelectric properties. Crystallization is typically carried out through high temperature annealing.

In order to both oxidize and crystallize a ferroelectric layer, high temperature anneals are typically carried out in the presence of oxygen. Typical processes thus attempt to crystallize and oxidize the ferroelectric layer in a single, high temperature step. It has been demonstrated, however, that the high temperatures associated with such single step anneals are detrimental to semiconductor barrier layers and underlying layers in the semiconductor substrate. In other words, when the oxidation process is carried out at a high temperature, the oxidation adversely affects underlying conductive layers. High temperature oxidization of conductive underlayers causes non-conductivity of the underlayers, yielding them useless.

A typical single step anneal is performed in the presence of oxygen at high temperatures, such as 700° C. or higher. Although most high-density ferroelectric or high dielectric constant materials employs a barrier layer to prevent oxidation of underlying layers, these one-step anneals even damage the barrier layers as well as the underlying layers when the oxidation is performed at high temperatures.

Thus, there is a need in the art for a process for both oxidizing and crystallizing ferroelectric materials without harming the barrier or the underlying layers. Although a low temperature deposition process in an oxygen ambient has been employed followed by a one step higher temperature anneal, a number of variables must be accounted for in this scenario. There is therefore a need in the art for a controlled process which both oxidizes at an optimal temperature and anneals at an optimal temperature.

SUMMARY OF THE INVENTION

The applicant has developed a post-deposition two-step method for oxidizing a ferroelectric layer at a low temperature, then crystallizing the ferroelectric layer in the absence of oxygen at a high temperature. After depositing the ferroelectric layer, the practitioner performs a low temperature anneal in the presence of oxygen, followed by a second, a high temperature crystallization anneal in the absence of oxygen. The second anneal is performed in the presence of a gas which is unreactive to the barrier layer or underlying layers, such as argon or $N_2$. Thus, oxidation occurs under optimal temperature conditions, yet the temperature is high enough for crystallization during the second anneal.

By separating the oxidation step and the high temperature crystallization step, a shorter diffusion length of time exists for oxygen to affect the underlayers. Thus, the underlayers can be preserved and the variables can be more accurately controlled. Because the oxidization step is separate from the more complex deposition step, it is possible to control the variable of low temperature oxidation in the absence of other variables. Quality is increased because of applicant's ability to closely parameterize the process flow.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

This invention discloses a method for forming a composite structure such as a semiconductor device, the method comprising providing a barrier layer on a semiconductor wafer, depositing a ferroelectric layer on the barrier layer, heating the semiconductor wafer at a temperature in a range between about 400° C. to about 700° C. in the presence of oxygen to oxidize the ferroelectric layer, then heating the semiconductor wafer at a temperature in a range of about 700° C. to about 900° C. in a non-oxidizing ambient to crystallize the oxidized ferroelectric layer.

Figure 1:
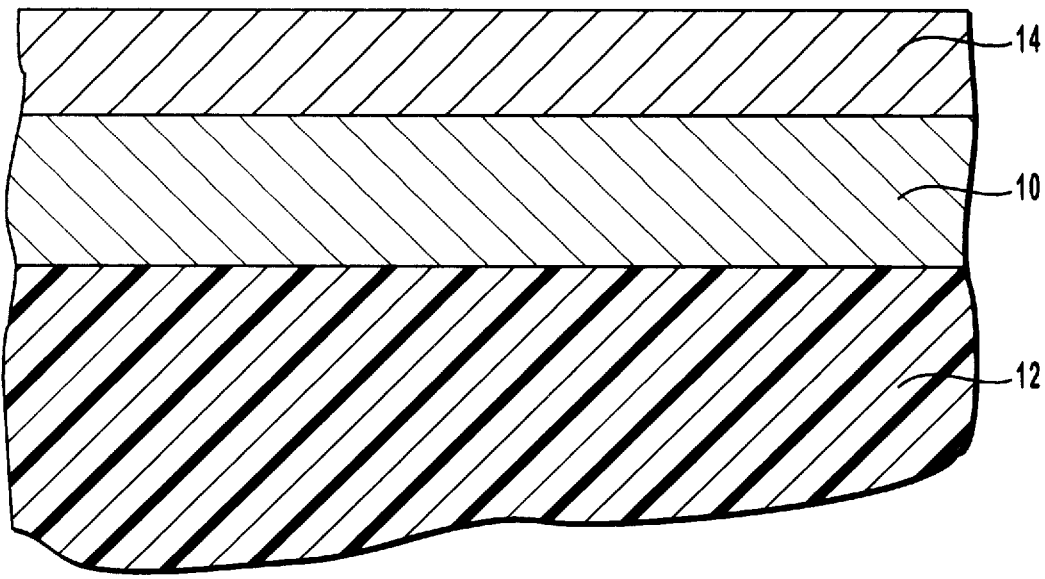
FIG. 1 is a partial cross-section of a semiconductor device demonstrating a substrate, a barrier layer, and a ferroelectric layer.

By way of example, and with reference to FIG. 1, the process comprises producing a barrier layer 10 on a substrate 12 and forming a ferroelectric layer 14 on the barrier layer 10. Preferably, barrier layer 10 is electrically conductive. Diffusion of oxygen to underlying layers in substrate 12 is not desired. In addition, it is undesirable to allow the underlying layers to diffuse through barrier layer 10 and incorporate themselves into ferroelectric layer 14. Barrier layer 10 is thus preferably an electrically conductive diffusion barrier layer.

Barrier layer 10 may be comprised of platinum, rubidium oxide (RbO), ruthenium oxide ($RuO_2$), or titanium nitride (TiN), for example, or may be comprised of TiPt, TiNPt, TiAlN—Pt, Ru, $RuO_2$, RuPt, $RuO_2$Pt, W, WPt, WSi, Ti, TiSi, Ta, TaN, TaSi, doped and undoped Poly Si, Al, Pd, Os, $OsO_x$, $IrO_2$, and Ir or any other suitable material for semiconductor applications.

An example of a preferred material for ferroelectric layer 14 of this process is strontium bismuth tantalate ($Sr_1Bi_2Ta_{2-4}O_9$). Other possible materials for ferroelectric layer 14 include, for example, any ferroelectric material where there is a need to crystallize, any high-density ferroelectric memory part, as well as dielectric materials, including high dielectric constant materials such as barium strontium titanate ($BaSrTiO_3$). Additional examples of ferroelectric materials to be used in ferroelectric layer 14 include $Ba(1-x)SrxO_3$, $PBZr(1-x)TixO_3$, PZT with various dopants such as LA etc., $Sr(1-x)BixTaO_3$, $Sr(1-x)BixTiO_3$ and all of the other Smolenski compounds, $PbMg(1-x)NbxTiO_3$ (PMN), compounds with $PbTiO_3$ (PMN-PT), $CaBi_2Nb_2O_9$, $SrBi_2Nb_2O_9$, $BaBi_2Nb_2O_9$, $PbBi_2Nb_2O_9$, $BiBi_2NbTiO_9$, $BaBi_4Ti_4O_{15}$, $CaBi_2Ta_2O_9$, $SrBi_2Ta_2O_9$, $BaBi_2Ta_2O_9$, $PbBi_2Ta_2O_9$, $Bi_4Ti_3O_{12}$, $SrBi_4Ti_4O_{15}$, $BaBi_4Ti_4O_{15}$, $PbBi_4Ti_4O_{15}$, $(Pb,Sr)Bi_2Nb_2O_9$, $(Pb,Ba)Bi_2Nb_2O_9$, $(Ba,Ca)Bi_2Nb_2O_9$, $(Ba,Sr)Bi_2Nb_2O_9$, $BaBi_2Nb_2O_9$, $Ba_{0.75}Bi_{2.25}Ti_{0.25}Nb_{1.75}O_9$, $Ba_{0.5}Bi_{2.5}Ti_{0.5}Nb_{1.5}O_9$, $Ba_{0.25}Bi_{2.75}Ti_{0.75}Nb_{1.25}O_9$, $Bi_3TiNbO_9$, $SrBi_2Nb_2O_9$, $Sr_{0.8}Bi_{2.2}Ti_{0.2}Nb_{1.8}O_9$, $Sr_{0.6}Bi_{2.4}Ti_{0.4}Nb_{1.6}O_9$, $Bi_3TiNbO_9$, $PbBi_2Nb_2O_9$, $Pb_{0.75}Bi_{2.25}Ti_{0.25}Nb_{1.75}O_9$, $Pb_{0.5}Bi_{2.5}Ti_{0.5}Nb_{1.5}O_9$, $Pb_{0.25}Bi_{2.75}Ti_{0.75}Nb_{1.25}O_9$, $Bi_3TiNbO_9$, $PbBi_4Ti_4O_{15}$, $Pb_{0.75}Bi_{4.25}Ti_{3.75}Ga_{0.25}O_{15}$, $Pb_{0.5}Bi_{4.5}Ti_{3.5}Ga_{0.5}O_{15}$, and $Bi_5Ti_3GaO_{15}$.

The thickness of ferroelectric layer 14 is preferably in the range of 2500 Å to 3500, Å most preferably about 2500Å. Ferroelectric layer 14 can be deposited on top of electrically conductive diffusion barrier layer 10 through a variety of processes known in the art, including an organometallic decomposition spin-on process (MOD) or metal organic chemical vapor deposition (MOCVD). Where an organometallic decomposition spin-on process is used to deposit ferroelectric layer 14, a solvent is introduced that should be baked out. Following a MOD deposition process, it is preferred to bake the semiconductor wafer at a temperature in the range of about 300° C. to about 400 ° C., or other suitable temperature, in order to evaporate off the solvent.

Following the baking process to remove solvents from the deposition of ferroelectric layer 14, a low temperature oxidation anneal is performed. A variety of heating processes exist for the performance of this anneal, including rapid thermal processing (RTP) and tube furnace processing environments. The semiconductor wafer is thus exposed to a temperature in the range of about 400° C. to about 700° C. in an oxygen ambient such that ferroelectric layer 14 is oxidized at a low enough temperature to prevent failure of electrically conducting diffusion barrier layer 10 or damage to other underlying layers. Higher temperatures risk crystallizing and oxidation of the underlying layers. In the preferred embodiment, the temperature during the oxidation process is about 650° C. In a tube furnace, the oxidation step would last about thirty minutes, whereas in an RTP chamber, the step would last for about 60 seconds.

Following the oxidation anneal, the oxygen in the heating chamber is evacuated, creating a non-oxidizing environment, before the temperature is increased to perform a crystallization anneal. A variety of processes exist for the performance of the crystallization anneal, which is performed in a non-oxidizing ambient, including rapid thermal processing, and heating in a tube furnace. The crystallization anneal is performed in a range of about 700° C. to about 900° C., preferably in the ambient of a gas which is not reactive to the barrier layer and/or underlying layers, such as argon or $N_2$. The crystallization step is preferably carried out at a temperature of about 800° C. It is preferred to perform the crystallization anneal in the same heating chamber in which the oxidizing anneal was performed.

While an ambient of $N_2$ is disclosed as a possible ambient for the crystallization anneal, argon may be employed in the crystallization step to prevent nitridized barriers from physically reacting with $N_2$. However, any noble gas or any gas which will not react with either the barrier layer or the underlying layers or both the barrier layer and the underlying layers may be employed in the crystallization anneal. As such, it is desirable to provide a nonreactive environment. For instance, if a titanium nitride layer exists as a barrier layer or an underlying layer, it would not be preferred to employ a nitrogen environment for the crystallization anneal because of a reaction between nitrogen and the titanium nitride layer below the ferroelectric layer, thus changing the volume and the stoichiometric ratio of titanium nitride layer to the detriment a composite structure being formed.

This process may be employed in a variety of configurations. For example, it is possible to deposit a conductive layer on ferroelectric layer 14 in FIG. 1 (conductive layer not shown), in steps for the creation a capacitor. The conductive layer may be made, for example, of platinum.

Figure 2:
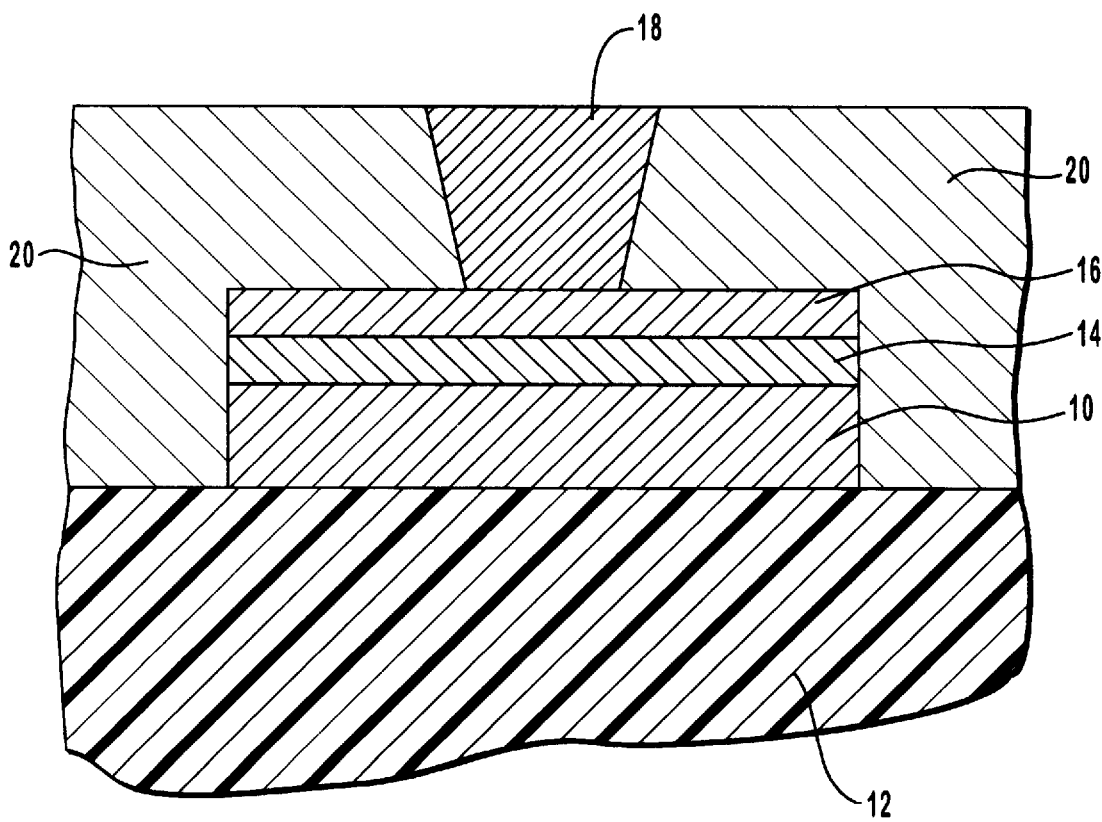
FIG. 2 is a partial cross-section of a semiconductor device demonstrating the layers of FIG. 1 and, in addition, a conductive layer deposited on the ferroelectric layer, a plug material deposited on the conductive layer, and insulating layers as shown.

Optionally, it is possible to deposit a conductive layer 16 on ferroelectric layer 14 as shown in FIG. 2. A conductive plug 18 is fabricated to overlie conductive layer 16. A polysilicon plug is one preferred choice for conductive plug 18, however, conductive plug 18 may be of other materials, including, for example, TiPt, TiNPt, TiAlN—Pt, Ru, $RuO_2$, RuPt, $RuO_2Pt$, W, WPt, WSi, Ti, TiSi, Ta, TaN, TaSi, doped and undoped Poly Si, Al, Pd and Ir. Insulating layers 20 are also disclosed.

It will be appreciated that the apparatus and methods of the present invention are capable of being incorporated in the form of a variety of embodiments, only a few of which have been illustrated and described above. The invention may be embodied in other forms without departing from its spirit or essential characteristics. The described embodiments are to be considered in all respects only as illustrative and not restrictive, and the scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for forming a composite structure, comprising:

providing a barrier layer situated on a semiconductor wafer;

depositing a ferroelectric layer on the barrier layer;

heating the semiconductor wafer at a temperature in a range of about 400° C. to about 700° C. in the presence of oxygen to oxidize the ferroelectric layer; and heating the semiconductor wafer at a temperature in a range of about 700° C. to about 900° C. in a non-oxidizing ambient to crystallize the oxidized, ferroelectric layer.

2. A method as in claim 1, wherein the barrier layer is selected from the group consisting of platinum, rubidium oxide, ruthenium oxide, titanium nitride, TiPt, TiNPt, TiAlN—Pt, Ru, $RuO_2$, RuPt, $RuO_2Pt$, W, WPt, WSi, Ti, TiSi, Ta, TaN, TaSi, doped polysilicon, undoped polysilicon, Al, Pd, Os, $OsO_x$, $IrO_2$, and Ir.

3. A method as in claim 1, wherein the ferroelectric layer is comprised of a material selected from the group consisting of strontium bismuth tantalate, $BaSrTiO_3$, $Ba(1-x)SrxO_3$, $PBZr(1-x)TixO_3$, PZT, $Sr(1-x)BixTaO_3$, $Sr(1-x)BixTiO_3$, all Smolenski compounds, $PbMg(1-x)NbxTiO_3$ (PMN), compounds with $PbTiO_3$ (PMN-PT), $CaBi_2Nb_2O_9$, $SrBi_2Nb_2O_9$, $BaBi_2Nb_2O_9$, $PbBi_2Nb_2O_9$, $BiBi_2NbTiO_9$, $BaBi_4Ti_4O_{15}$, $CaBi_2Ta_2O_9$, $SrBi_2Ta_2O_9$, $BaBi_2Ta_2O_9$, $PbBi_2Ta_2O_9$, $Bi_4Ti_3O_{12}$, $SrBi_4Ti_4O_{15}$, $BaBi_4Ti_4O_{15}$, $PbBi_4Ti_4O_{15}$, $(PbSr)Bi_2Nb_2O_9$, $(Pb,Ba)Bi_2Nb_2O_9$, $(Ba,Ca)$ $Bi_2Nb_2O_9$, $(Ba,Sr)Bi_2Nb_2O_9$, $BaBi_2Nb_2O_9$, $Ba_{0.75}Bi_{2.25}Ti_{0.25}Nb_{1.75}O_9$, $Ba_{0.5}Bi_{2.5}Ti_{0.5}Nb_{1.5}O_9$, $Ba_{0.25}Bi_{2.75}Ti_{0.75}Nb_{1.25}O_9$, $Bi_3TiNbO_9$, $SrBi_2Nb_2O_9$, $Sr_{0.8}Bi_{2.2}Ti_{0.2}Nb_{1.8}O_9$, $Sr_{0.6}Bi_{2.4}Ti_{0.4}Nb_{1.6}O_9$, $Bi_3TiNbO_9$, $PbBi_2Nb_2O_9$, $Pb_{0.75}Bi_{2.25}Ti_{0.25}Nb_{1.75}O_9$, $Pb_{0.5}Bi_{2.5}Ti_{0.5}Nb_{1.5}O_9$, $Pb_{0.25}Bi_{2.75}Ti_{0.75}Nb_{1.25}O_9$, $Bi_3TiNbO_9$, $PbBi_4Ti_4O_{15}$, $Pb_{0.75}Bi_{4.25}Ti_{3.75}Ga_{0.25}O_{15}$, $Pb_{0.5}Bi_{4.5}Ti_{3.5}Ga_{0.5}O_{15}$, and $Bi_5Ti_3GaO_{15}$.

4. A method as in claim 1, wherein the step of depositing a ferroelectric layer on the barrier layer is a MOD process that introduces a solvent with the deposition of the ferroelectric layer, and wherein said method further comprises the step of baking the semiconductor wafer after the step of depositing a ferroelectric layer on the barrier layer to remove said solvent.

5. A method as in claim 1, wherein the step of heating the semiconductor wafer at a temperature in a range of about 700° C. to about 900° C. to crystallize the oxidized, ferroelectric layer is conducted at about 800° C.

6. A method as in claim 1, wherein the non-oxidizing ambient is an ambient gas which is unreactive with the barrier layer.

7. A method as in claim 1, wherein the non-oxidizing ambient is a noble gas.

8. A method as in claim 1, wherein the non-oxidizing ambient is a gas selected from the group consisting of argon and nitrogen.

9. A method as in claim 1, wherein the barrier layer is comprised of an electrically conductive diffusion barrier layer.

10. A method as in claim 1, wherein the ferroelectric layer is an electrically insulating layer.

11. A method as in claim 1, wherein the ferroelectric layer is oxidized and crystallized without oxidizing the barrier layer.

12. A method as in claim 1, further comprising depositing a conductive layer on the ferroelectric layer.

13. A method as in claim 12, further comprising depositing a plug material on the conductive layer.

14. A method as in claim 1, wherein the step of heating the semiconductor wafer at a temperature in a range of about 400° C. to about 700° C. in the presence of oxygen to oxidize the ferroelectric layer is conducted at about 650° C.

15. A method as in claim 1, wherein:
   the step of heating the semiconductor wafer at a temperature in a range of about 400° C. to about 700° C. in the presence of oxygen to oxidize the ferroelectric layer semiconductor wafer is an RTP process; and wherein
   the step of heating the semiconductor wafer at a temperature in a range of about 700° C. to about 900° C. to crystallize the oxidized, ferroelectric layer is an RTP process.

16. A method as in claim 15, further comprising the step of evacuating the presence of oxygen from the semiconductor prior to the step of heating the semiconductor wafer at a temperature in a range of about 700° C. to about 900° C. to crystallize the oxidized, ferroelectric layer.

17. A method for forming a semiconductor device, comprising:
   providing a barrier layer situated on a semiconductor wafer;
   depositing a ferroelectric layer on the barrier layer;
   heating the semiconductor wafer in an RTP environment at a temperature in a range of about 400° C. to about 700° C. in the presence of oxygen to oxidize the ferroelectric layer; and
   heating the semiconductor wafer in an RTP environment at a temperature in a range of about 700° C. to about 900° C. in a non-oxidizing ambient in the presence of a gas selected from the group consisting of argon, nitrogen, and noble gases to crystallize the oxidized, ferroelectric layer.

18. A method as in claim 17, wherein the barrier layer is selected from the group consisting of platinum, rubidium oxide, ruthenium oxide, titanium nitride, TiPt, TiNPt, TiAlN—Pt, Ru, $RuO_2$, RuPt, $RuO_2$Pt, W, WPt, WSi, Ti, TiSi, Ta, TaN, TaSi, doped polysilicon, undoped polysilicon, Al, Pd, Os, $OsO_x$, $IrO_2$, and Ir.

19. A method as in claim 17, wherein the ferroelectric layer is comprised of a material selected from the group consisting of strontium bismuth tantalate, $BaSrTiO_3$, $Ba(1-x)SrxO_3$, $PBZr(1-x)TixO_3$, PZT, $Sr(1-x)BixTaO_3$, $Sr(1-x)BixTiO_3$, all Smolenski compounds, $PbMg(1-x)NbxTiO_3$ (PMN), compounds with $PbTiO_3$ (PMN-PT), $CaBi_2Nb_2O_9$, $SrBi_2Nb_2O_9$, $BaBi_2Nb_2O_9$, $PbBi_2Nb_2O_9$, $BiBi_2NbTiO_9$, $BaBi_4Ti_4O_{15}$, $CaBi_2Ta_2O_9$, $SrBi_2Ta_2O_9$, $BaBi_2Ta_2O_9$, $PbBi_2Ta_2O_9$, $Bi_4Ti_3O_{12}$, $SrBi_4Ti_4O_{15}$, $BaBi_4Ti_4O_{15}$, $PbBi_4Ti_4O_{15}$, $(PbSr)Bi_2Nb_2O_9$, $(Pb,Ba)Bi_2Nb_2O_9$, $(Ba,Ca)Bi_2Nb_2O_9$, $(Ba,Sr)Bi_2Nb_2O_9$, $BaBi_2Nb_2O_9$, $Ba_{0.75}Bi_{2.25}Ti_{0.25}Nb_{1.75}O_9$, $Ba_{0.5}Bi_{2.5}Ti_{0.5}Nb_{1.5}O_9$, $Ba_{0.25}Bi_{2.75}Ti_{0.75}Nb_{1.25}O_9$, $Bi_3TiNbO_9$, $SrBi_2Nb_2O_9$, $Sr_{0.8}Bi_{2.2}Ti_{0.2}Nb_{1.8}O_9$, $Sr_{0.6}Bi_{2.4}Ti_{0.4}Nb_{1.6}O_9$, $Bi_3TiNbO_9$, $PbBi_2Nb_2O_9$, $Pb_{0.75}Bi_{2.25}Ti_{0.25}Nb_{1.75}O_9$, $Pb_{0.5}Bi_{2.5}Ti_{0.5}Nb_{1.5}O_9$, $Pb_{0.25}Bi_{2.75}Ti_{0.75}Nb_{1.25}O_9$, $Bi_3TiNbO_9$, $PbBi_4Ti_4O_{15}$, $Pb_{0.75}Bi_{4.25}Ti_{3.75}Ga_{0.25}O_{15}$, $Pb_{0.5}Bi_{4.5}Ti_{3.5}Ga_{0.5}O_{15}$, and $Bi_5Ti_3GaO_{15}$.

20. A method as in claim 17, wherein the step of depositing a ferroelectric layer on the barrier layer is a MOD process that introduces a solvent with the deposition of the ferroelectric layer.

21. A method as in claim 20, further comprising the step of baking the semiconductor wafer after the step of depositing a ferroelectric layer on the barrier layer to remove said solvent.

22. A method as in claim 17, wherein the semiconductor wafer is heated by a tube furnace process.

23. A method as in claim 17, wherein the ferroelectric layer is an electrically insulating layer.

24. A method as in claim 17, wherein the ferroelectric layer is oxidized and crystallized without oxidizing the barrier layer.

25. A method as in claim 17, further comprising depositing a conductive layer on the ferroelectric layer.

26. A method as in claim 25, further comprising depositing a plug on the conductive layer.

27. A method as in claim 17, wherein
   the step of heating the semiconductor wafer at a temperature in a range of about 400° C. to about 700° C. in the presence of oxygen to oxidize the ferroelectric layer semiconductor wafer is conducted at temperature of about 650° C.; and
   the step of heating the semiconductor wafer at a temperature in a range of about 700° C. to about 900° C. to crystallize the oxidized, ferroelectric layer is conducted at a temperature of about 800° C.

28. A method as in claim 17, further comprising the step of evacuating the presence of oxygen from the semiconductor wafer prior to the step of heating the semiconductor wafer at a temperature in a range of about 700° C. to about 900° C. to crystallize the oxidized, ferroelectric layer.

29. A method for forming a semiconductor device, comprising:
   providing an diffusion barrier layer on a semiconductor wafer, wherein the barrier layer is comprised of a material selected from the group consisting of platinum, rubidium oxide, ruthenium oxide, titanium nitride, TiPt, TiNPt, TiAlN—Pt, Ru, $RuO_2$, RuPt, $RuO_2Pt$, W, WPt, WSi, Ti, TiSi, Ta, TaN, TaSi, doped polysilicon, undoped polysilicon, Al, Pd, Os, $OsO_x$, $IrO_2$, and Ir;

depositing a ferroelectric layer on the barrier layer, wherein the ferroelectric layer is comprised of a material selected from the group consisting of strontium bismuth tantalate, $BaSrTiO_3$, $Ba(1-x)SrxO_3$, $PBZr(1-x)TixO_3$, PZT, $Sr(1-x)BixTaO_3$, $Sr(1-x)BixTiO_3$, all Smolenski compounds, $PbMg(1-x)NbxTiO_3$ (PMN), compounds with $PbTiO_3$ (PMN-PT), $CaBi_2Nb_2O_9$, $SrBi_2Nb_2O_9$, $BaBi_2Nb_2O_9$, $PbBi_2Nb_2O_9$, $BiBi_2NbTiO_9$, $BaBi_4Ti_4O_{15}$, $CaBi_2Ta_2O_9$, $SrBi_2Ta_2O_9$, $BaBi_2Ta_2O_9$, $PbBi_2Ta_2O_9$, $Bi_4Ti_3O_{12}$, $SrBi_4Ti_4O_{15}$, $BaBi_4Ti_4O_{15}$, $PbBi_4Ti_4O_{15}$, $(PbSr)Bi_2Nb_2O_9$, $(Pb,Ba)Bi_2Nb_2O_9$, $(Ba,Ca)Bi_2Nb_2O_9$, $(Ba,Sr)Bi_2Nb_2O_9$, $BaBi_2Nb_2O_9$, $Ba_{0.75}Bi_{2.25}Ti_{0.25}Nb_{1.75}O_9$, $Ba_{0.5}Bi_{2.5}Ti_{0.5}Nb_{1.5}O_9$, $Ba_{0.25}Bi_{2.75}Ti_{0.75}Nb_{1.25}O_9$, $Bi_3TiNbO_9$, $SrBi_2Nb_2O_9$, $Sr_{0.8}Bi_{2.2}Ti_{0.2}Nb_{1.8}O_9$, $Sr_{0.6}Bi_{2.4}Ti_{0.4}Nb_{1.6}O_9$, $Bi_3TiNbO_9$, $PbBi_2Nb_2O_9$, $Pb_{0.75}Bi_{2.25}Ti_{0.25}Nb_{1.75}O_9$, $Pb_{0.5}Bi_{2.5}Ti_{0.5}Nb_{1.5}O_9$, $Pb_{0.25}Bi_{2.75}Ti_{0.75}Nb_{1.25}O_9$, $Bi_3TiNbO_9$, $PbBi_4Ti_4O_{15}$, $Pb_{0.75}Bi_{4.25}Ti_{3.75}Ga_{0.25}O_{15}$, $Pb_{0.5}Bi_{4.5}Ti_{3.5}Ga_{0.5}O_{15}$, and $Bi_5Ti_3GaO_{15}$;

heating the semiconductor wafer in a heating chamber at a temperature in a range of about 400° C. to about 700° C. in the presence of oxygen to oxidize the ferroelectric layer;

heating the semiconductor wafer in the heating chamber at a temperature in a range of about 700° C. to about 900° C. in the presence of a gas which is nonreactive with the barrier layer in a non-oxidizing ambient to crystallize the oxidized, ferroelectric layer, whereby the oxidized, ferroelectric layer is crystallized without oxidizing the barrier layer.

30. A method as in claim 29, wherein the gas which is non-reactive with the barrier layer is a noble gas.

31. A method as in claim 29, wherein the gas which is nonreactive with the barrier layer is selected from the group consisting of argon or nitrogen.

32. A method as in claim 29, wherein the ferroelectric layer is an electrical insulative layer.

33. A method as in claim 29, further comprising the step of forming a conductive layer on the ferroelectric layer.

34. A method as in claim 33, further comprising the step of forming a plug on the conductive layer.

35. A method as in claim 29, wherein:

the step of heating the semiconductor wafer at a temperature in a range of about 400° C. to about 700° C. in the presence of oxygen to oxidize the ferroelectric layer semiconductor wafer is conducted at a temperature of about 650° C.; and the step of heating the semiconductor wafer at a temperature in a range of about 700° C. to about 900° C. to crystallize the oxidized, ferroelectric layer is conducted at a temperature of about 800° C.

36. A method as in claim 29, wherein the step of depositing a ferroelectric layer on the barrier layer is a MOD process that introduces a solvent with the deposition of the ferroelectric layer, and the method further comprises the step, prior to the step of heating the semiconductor wafer in a heating chamber at a temperature in a range of about 400° C. to about 700° C. in the presence of oxygen to oxidize the ferroelectric layer, of baking the semiconductor wafer to remove said solvent.

37. A method as in claim 29, further comprising the step of evacuating the oxygen from the heating chamber, creating a non-oxidizing ambient prior to the step of heating the semiconductor wafer in the heating chamber at a temperature in a range of about 700° C. to about 900° C. in the presence of a gas which is non-reactive with the barrier layer.

* * * * *

UNITED STATES PATENT AND TRADEMARK OFFICE
CERTIFICATE OF CORRECTION

PATENT NO. : 5,824,590
DATED : Oct. 20, 1998
INVENTOR(S) : Daryl C. New

It is certified that error appears in the above-identified patent and that said Letters Patent is hereby corrected as shown below:

Cover Page, Right Column, insert the following under Other Publications
--"Novel Stacked Capacitor Technology for 1 Gbit DRAM with CVD-(Ba,Sr) $T1O_3$ Thin Films on a Thick Storage Node of Ru," A. Yuuki, M. Yamamuka, T. Makita, T. Horikawa, T. Shibano, N. Hirano, H. Maeda, N. Mikaumi, K. Ono, H. Ogata, and H. Abe, Mitsubishi Electric Corporation, International Electron Device Meeting (I.E.D.M.), December 1995, pp. 115-118.--

Cover Page, Abstract, line 6, after "The" insert --two-step method--

Col. 1, line 40, after "materials" change "employs" to --employ--

Col. 4, line 10, after "detriment" change "a" to --of the--

Col. 4, line 67, change "(PbSr)$Bi_2Nb_2O_9$," to --(Pb,Sr)$Bi_2Nb_2O_9$,--

Col. 6, line 66, after "providing" change "an" to --a--

Col. 7, line 17, change "(PbSr)$Bi_2Nb_2O_9$," to --(Pb,Sr)$Bi_2Nb_2O_9$,--

Col. 8, line 19, after "of" delete the carriage return

Signed and Sealed this

Twenty-seventh Day of July, 1999

Attest:

Q. TODD DICKINSON

*Attesting Officer*  *Acting Commissioner of Patents and Trademarks*

UNITED STATES PATENT AND TRADEMARK OFFICE
CERTIFICATE OF CORRECTION

PATENT NO.    : 5,824,590
DATED         : October 20, 1998
INVENTOR(S)   : Daryl C. New It is certified that error appears in the above-identified patent and that said Letters Patent is hereby corrected as shown below:

At beginning of the patent please add the following:
-- This invention was made with United States Government support under contract No. MDA972-94-C-0006 awarded by the Advanced Research Projects Agency (ARPA). The United States Government has certain rights in this invention. --

Signed and Sealed this

Sixteenth Day of October, 2001

Attest:

*Attesting Officer*

NICHOLAS P. GODICI
*Acting Director of the United States Patent and Trademark Office*